United States Patent
Choi et al.

(10) Patent No.: US 12,317,421 B2
(45) Date of Patent: May 27, 2025

(54) APPARATUS INCLUDING A PLURALITY OF HEADS AND A METHOD OF USING THE SAME

(71) Applicant: CANON KABUSHIKI KAISHA, Tokyo (JP)

(72) Inventors: Byung-Jin Choi, Austin, TX (US); Anshuman Cherala, Austin, TX (US)

(73) Assignee: CANON KABUSHIKI KAISHA, Tokyo (JP)

( * ) Notice: Subject to any disclaimer, the term of this patent is extended or adjusted under 35 U.S.C. 154(b) by 180 days.

(21) Appl. No.: 17/935,768

(22) Filed: Sep. 27, 2022

(65) Prior Publication Data
US 2024/0107735 A1    Mar. 28, 2024

(51) Int. Cl.
*H05K 13/04* (2006.01)
*H01L 23/00* (2006.01)
*H05K 13/08* (2006.01)

(52) U.S. Cl.
CPC .......... *H05K 13/0411* (2018.08); *H01L 24/75* (2013.01); *H05K 13/041* (2018.08); *H01L 24/74* (2013.01); *H05K 13/0882* (2018.08)

(58) Field of Classification Search
CPC ....... H01L 24/74; H01L 24/75; H05K 13/041; H05K 13/0411; H05K 13/0882
See application file for complete search history.

(56) References Cited

U.S. PATENT DOCUMENTS

| | | |
|---|---|---|
| 9,530,557 B2 | 12/2016 | Park |
| 10,285,314 B2 | 5/2019 | Nishiyama |
| 11,026,360 B2 | 6/2021 | Sueno |

(Continued)

FOREIGN PATENT DOCUMENTS

| | | |
|---|---|---|
| JP | 2002176291 A | 6/2002 |
| JP | 2006310647 A | 11/2006 |

(Continued)

OTHER PUBLICATIONS

Kira et al, "Development of a stacking technology for large-sized chips using non-conductive film," 2016 IEEE CPMT Symposium Japan (ICSJ), Kyoto, Japan, 2016, pp. 103-106. (Year: 2016).*

(Continued)

*Primary Examiner* — A. Dexter Tugbang
(74) *Attorney, Agent, or Firm* — Abel Schillinger, LLP

(57) ABSTRACT

An apparatus can include a support structure and a docking station, wherein the apparatus is configured to move the docking station relative to the support structure. The apparatus can further include a head among a plurality of heads. The apparatus can also include a first coupler configured to couple the head to the support structure and to decouple the head from the support structure and a second coupler configured to couple the head to the docking station and to decouple the head from the docking station. A method of using the apparatus can include coupling the head to the docking station and decoupling the first head from the support structure. The method can further include moving the docking station along the support structure. The method can also include coupling the head to the support structure and decoupling the head from the docking station.

19 Claims, 10 Drawing Sheets

(56) References Cited

U.S. PATENT DOCUMENTS

| | | | |
|---|---|---|---|
| 2005/0245003 A1* | 11/2005 | Noda | H01L 24/75 |
| | | | 257/E23.04 |
| 2009/0007420 A1 | 1/2009 | Kabeshita et al. | |
| 2009/0023243 A1 | 1/2009 | Koyanagi | |
| 2011/0036897 A1* | 2/2011 | Nakai | H01L 24/75 |
| | | | 228/1.1 |
| 2012/0104074 A1 | 5/2012 | Lyu | |
| 2017/0338136 A1 | 11/2017 | Kai | |
| 2018/0122845 A1* | 5/2018 | Kim | H01L 24/74 |
| 2018/0174871 A1 | 6/2018 | Lee et al. | |
| 2019/0006211 A1 | 1/2019 | Seyama | |
| 2021/0013065 A1 | 1/2021 | Chen | |
| 2022/0005720 A1 | 1/2022 | Zhang | |
| 2022/0051916 A1* | 2/2022 | Sung | H01L 24/75 |
| 2023/0245996 A1 | 8/2023 | Sreenivasan | |

FOREIGN PATENT DOCUMENTS

| | | | |
|---|---|---|---|
| JP | 2007329347 A | | 12/2007 |
| JP | 2012191161 A | * | 10/2012 |
| JP | 5813208 B2 | | 11/2015 |
| WO | 2015023232 A1 | | 2/2015 |
| WO | 2022212260 A1 | | 10/2022 |
| WO | 2023056068 A1 | | 4/2023 |
| WO | 2023056072 A1 | | 4/2023 |

OTHER PUBLICATIONS

International Search Report with regard to International Application No. PCT/US2023/28136, dated Oct. 24, 2023, pp. 1-3.

* cited by examiner

APPARATUS INCLUDING A PLURALITY OF HEADS AND A METHOD OF USING THE SAME

FIELD OF THE DISCLOSURE

The present disclosure relates to apparatuses including pluralities of heads and methods of using the apparatuses.

RELATED ART

Advanced packaging technologies demand high throughput and precise placement of chips. Hybrid bonding can be particularly challenging with small misalignment tolerances. A single-chip transfer technique can achieve high precision but has a low throughput. A multi-chip transfer technique can achieve the high throughput, but precise placement of chips can be difficult. A need exists for a placement high throughput while still meeting specifications for chip placement.

SUMMARY

In an aspect, an apparatus can include a support structure; a docking station, wherein the apparatus is configured to move the docking station relative to the support structure; a head among a plurality of heads, wherein the head has a chip retention region; a first coupler configured to couple the head to the support structure and to decouple the head from the support structure; and a second coupler configured to couple the head to the docking station and to decouple the head from the docking station.

In an embodiment, the head further includes a body and a chip chuck, wherein the head is configured to allow motion of the chip chuck relative to the support structure.

In another embodiment, the second coupler is configured such that the docking station does not contact the chip retention region.

In a further embodiment, the chip retention region occupies a center portion of a surface facing away from the support structure, and the head has a first coupling zone that is disposed between a first peripheral side of the head and the chip retention region.

In a particular embodiment, the first coupling zone is along a first major side of the head, and the head has a second coupling zone along a second major side of the head, wherein the second major side is opposite the first major side.

In another particular embodiment, the chip retention region is recessed into the head.

In another embodiment, the first coupler, the second coupler, or each of the first coupler and the second coupler includes a zone-based vacuum chuck that is part of or coupled to the support structure.

In still another embodiment, the apparatus is configured to allow the head to be moved closer to and away from the support structure.

In yet another embodiment, the apparatus further includes a controller configured to transmit a signal to move the body of the head from a first position on the support structure to a second position on the support structure.

In a further embodiment, the apparatus further includes a positioning stage coupled to the docking station and configured to move the docking station relative to the support structure.

In a particular embodiment, the apparatus further includes a destination chuck coupled to the positioning stage.

In a more particular embodiment, the apparatus further includes a base spaced apart from the support structure, wherein the positioning stage is coupled to the base; and a source substrate coupled to the support structure, wherein the support structure includes a bridge.

In an even more particular embodiment, the plurality of heads is a plurality of bonding heads, and the apparatus further includes a pick-up head stage coupled to the base and a plurality of pick-up heads coupled to the pick-up head stage.

In another aspect, a method can include coupling a first head to a docking station by activating a first coupler associated with the docking station, wherein a plurality of heads includes the first head, and the first head has a chip retention region; decoupling the first head from a support structure by deactivating a second coupler associated with the support structure; and moving the docking station from a first location along the support structure to a second location along the support structure; coupling the first head to the support structure by activating a third coupler; and decoupling the first head from the docking station by deactivating the first coupler.

In an embodiment, the method further includes coupling a second head to the docking station by activating a fourth coupler associated with the docking station, wherein the plurality of heads includes the second head, and the second head has a chip retention region, and decoupling the second head from the support structure by deactivating a fifth coupler associated with the support structure. The method can further include moving the docking station from a third location along the support structure to a fourth location along the support structure, coupling the second head to the support structure by activating the sixth coupler, and decoupling the second head from the docking station by deactivating the fourth coupler.

In a particular embodiment, the plurality of heads has a first pitch before moving the docking station from the first location to the second location and before moving the docking station from the third location to the fourth location, and the plurality of heads has a second pitch after moving the docking station from the first location to the second location and after moving the docking station from the third location to the fourth location, wherein the second pitch is different from the first pitch.

In a more particular embodiment, the method further includes mounting a destination substrate onto a destination chuck coupled to the positioning stage, wherein the destination substrate has a plurality of destination bonding sites at a destination pitch, wherein the destination pitch is closer to the second pitch than to the first pitch.

In another embodiment, moving the docking station is performed between a pair of transfer operations, the plurality of heads includes a second head, and the second head has a chip retention region, and the second head is coupled to the support structure and is not moved between the pair of transfer operations.

In still another embodiment, the first head has a first side adjacent to the support structure and a second side adjacent to the docking station, and the chip retention region is along the second side. Coupling the first head to the docking station is performed such that a portion of the first head along the second side contacts (1) the docking station, and the chip retention region does not contact the docking station or (2) contacts a component coupled to the docking station, and the chip retention region does not contact the component coupled to the docking station.

In yet another embodiment, the plurality of heads is a plurality of bonding heads.

In a further embodiment, the method further includes picking up a set of chips from a source substrate with a plurality of pick-up heads, wherein the plurality of pick-up heads is at a source-matching pitch when picking up the set of chips; adjusting the plurality of pick-up heads holding the set of chips to a bonding head-matching pitch; transferring the set of chips from the plurality of pick-up heads to the plurality of bonding heads, wherein the plurality of bonding heads includes the first head, wherein transferring is performed after the first head is moved using the docking station. The method further includes measuring alignment errors of the chips held by the plurality of bonding heads; adjusting positions of at least one of the chips held by a bonding head of the plurality of bonding heads relative to a destination substrate on a destination chuck based on the alignment errors; and bonding the set of chips to the destination substrate with the plurality of bonding heads.

BRIEF DESCRIPTION OF THE DRAWINGS

Implementations are illustrated by way of example and are not limited in the accompanying figures.

Skilled artisans appreciate that elements in the figures are illustrated for simplicity and clarity and have not necessarily been drawn to scale. For example, the dimensions of some of the elements in the figures can be exaggerated relative to other elements to help improve understanding of implementations of the invention.

DETAILED DESCRIPTION

The following description in combination with the figures is provided to assist in understanding the teachings disclosed herein. The following discussion will focus on specific implementations and implementations of the teachings. This focus is provided to assist in describing the teachings and should not be interpreted as a limitation on the scope or applicability of the teachings.

Unless otherwise defined, all technical and scientific terms used herein have the same meaning as commonly understood by one of ordinary skill in the art to which this invention belongs. The materials, methods, and examples are illustrative only and not intended to be limiting. To the extent not described herein, many details regarding specific materials and processing acts are conventional and can be found in textbooks and other sources within the arts.

An apparatus can include a docking station that can move bonding heads, where the docking station allows very precise and accurate placement of bonding heads. The apparatus can include a bridge and the docking station, wherein the apparatus is configured to move the docking station relative to the bridge. The apparatus can further include a head among a plurality of heads, wherein the head has a chip retention region. The apparatus can further include a bridge-side coupler configured to couple the head to the bridge and to decouple the head from the bridge, and a docking-side coupler configured to couple the head to the docking station and to decouple the head from the docking station. In an embodiment, the docking station can be coupled to a destination stage that allows for precise and accurate positioning of the docking station with respect to corresponding locations along the bridge. Hence, existing equipment can be modified for the docking station to allow locations of bonding heads to be changed for different destination substrate designs.

Changing a bonding head pitch for an array of bonding heads is performed less frequently as compared to changing a pick-up head pitch for an array of pick-up heads. Fewer pitch changes for the array of bonding heads allows more focus on stability rather than dynamic/fast performance that is more of a focus for the array of pick-up heads. The apparatus and method of using the apparatus is better understood with the description below in conjunction with the corresponding figures. While much of the description addresses repositioning bonding heads, concepts as described herein can be used to reposition pick-up heads.

Figure 1:
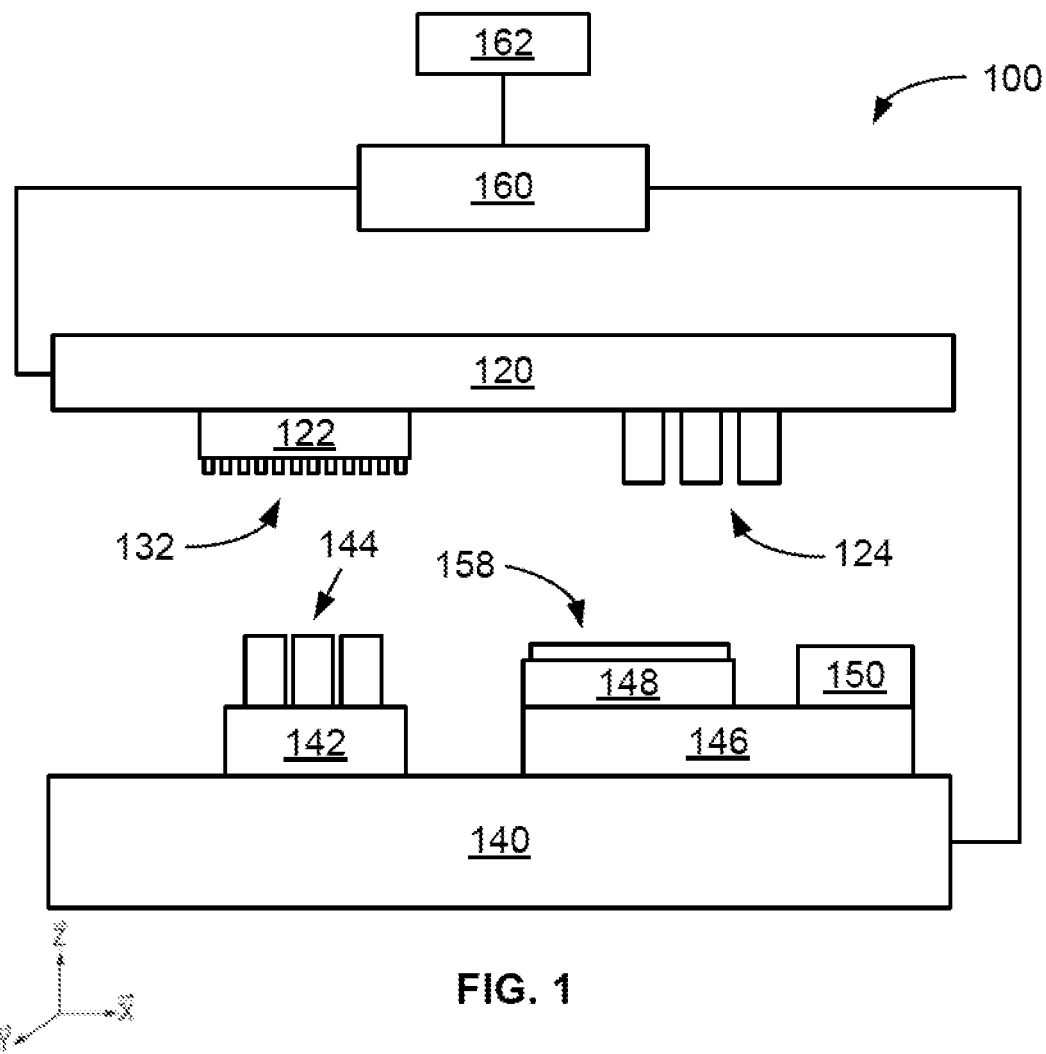
FIG. 1 includes a conceptual view of an apparatus that can be used in transferring chips from a source substrate to a destination substrate.

FIG. 1 includes a conceptual diagram of an apparatus 100 that can be used to transfer a plurality of chips 132 coupled to a source chuck 122 to a destination substrate 158 coupled to a destination chuck 148. The apparatus 100 includes a bridge 120, a base 140, and a controller 160 that is coupled to the bridge 120, the base 140, or to one or more components coupled to the bridge 120 or the base 140. Each of the bridge 120 and the base 140 can be a support structure. The bridge 120 can be coupled to a source chuck 122 and an array of bonding heads 124. The base 140 can be coupled to a pick-up head stage 142 and a destination stage 146. The apparatus 100 in FIG. 1 can include registration, alignment, and metrology hardware, firmware, software, or a combination thereof; however, such registration, alignment, and metrology hardware, firmware, software, or the combination are not illustrated in FIG. 1 to simplify understanding of the apparatus.

In FIG. 1 and other figures, the bridge 120, the base 140, and components physically coupled to the bridge 120 or the base 140 can be organized along an X-direction, a Y-direction, a Z-direction, or a combination thereof. With respect to cross-sectional or side views, the X-direction is between the left-hand and right-hand sides of the drawings, the Z-direction is between the top and bottom of the drawings, and the Y-direction is into and out of the drawing sheet. Unless explicitly stated to the contrary, rotation occurs along a X-Y plane defined by the X-direction and Y-direction.

Components within the apparatus 100 will be generally described in the order a set of chips from the plurality of chips 132 would be transferred from the source chuck 122 to the destination substrate 158. Due to similarities in operation, the pick-up head stage 142 and the destination stage 146 are described in the same passage later in this specification.

The terms "transfer operation" and "transfer cycle" are addressed to aid in understanding embodiments as described herein. A transfer operation starts no later than picking up a set of chips within the plurality of chips 132 from the source chuck 122 and ends with the last set of chips transferred to the destination substrate 158. A transfer cycle starts no later than picking up a particular set of chips from the source chuck 122 until that same particular set of chips is transferred to the destination substrate 158. A transfer operation can include one or more transfer cycles.

The source chuck 122 can be a vacuum chuck, pin-type chuck, a groove-type chuck, an electrostatic chuck, an electromagnetic chuck, or the like. The source chuck 122 can be coupled to the bridge 120 by being attached to the bridge directly or can be coupled to the bridge via a stage (not illustrated). The source chuck 122 has a source holding surface that faces the base 140 or a component coupled to the base 140.

The plurality of chips 132 can be attached to a source substrate (not separately illustrated) coupled to the source chuck 122 that is coupled to the bridge 120. The source substrate can hold the plurality of the chips 132, all or which or only a part of the plurality, are to be transferred to the destination substrate. The source substrate can be an initial substrate or an intermediate substrate. The source substrate can be an adhesive tape that may be in the form of a tape frame or tape reel, a container having a lattice that defines a matrix of regions that can hold the plurality of chips 132, or the like.

A chip within the plurality of chips 132 can include a microprocessor, a microcontroller, a graphic processing unit, a digital signal processor, a memory chip (for example, a Level 2 or Level 3 cache, a flash memory, or the like), a power transistor chip, a power circuit chip, or the like. The chip has a device side, which has most or all of the electrical circuit elements of the chip, and a back side opposite the device side. In the embodiment as illustrated in FIG. 1, the back sides of the chips within the plurality of chips 132 are disposed between the source chuck 122 and the device sides of the chips. In another embodiment, the device sides of the chips within the plurality of chips 132 are disposed between the source chuck 122 and the back sides of the chips. The sides of the chips facing the base 140 or a component coupled to the base are activated for hybrid bonding to the destination substrate 158. In an embodiment, the device side of the chip may include a plurality of chip bonding sites which will be bonded to corresponding destination substrate bonding sites by the apparatus 100, so as to form an electrical connection between the chip bonding sites and the destination substrate bonding sites. The chip has a back side opposite the device side, the back side may also include back side bonding sites which may act as future destination substrate bonding sites which will be used at a later time.

The pick-up head stage 142 and the destination stage 146 are positioning stages and coupled to the base 140 and can provide translating motion along the base 140 in the X-direction, Y-direction, or Z-direction or rotational motion about one or more of axes, such as rotation about a Z-axis and along a plane lying along the X-direction and Y-direction. The pick-up head stage 142 and the destination stage 146 can be moved together or independently relative to each other. The pick-up head stage 142 and the destination stage 146 can be the same type or different types of stages.

The array of pick-up heads 144 are coupled to the pick-up head stage 142 and have pick-up surfaces that face the bridge 120 or a component coupled to the bridge 120. In an embodiment, the pick-up head may be retained by a chip chuck that is a vacuum chuck, pin-type chuck, a groove-type chuck, an electrostatic chuck, or an electromagnetic chuck.

The array of pick-up heads 144 can be configured as a vector (a row or a column of pick-up heads) or as a matrix (at least two rows and at least two columns of pick-up heads). Regarding the matrix, the number of bonding heads within the array of pick-up heads 144 may be different between rows, between columns, or between rows and columns. Some array configurations can be 3×1, 6×1, 2×2, 2×3, 2×4, 4×2, 10×10, or another rectangular shape, where the first number corresponds to the number of pick-up heads along a row or column, and the second number corresponds to the number of pick-up heads along the other of the row or column. In theory, chips from an entire source wafer may be transferred all at once. For such a configuration, the array of pick-up heads 144 will have fewer pick-up heads along rows closer to the top and bottom of the array as compared to the row or the pair of rows closest to the center of the array, and the array of pick-up heads 144 will have fewer pick-up heads along columns closer to the left-side and right-side of the array as compared to the column or the pair of columns closest to the center of the array. After reading this specification, skilled artisans will be able to determine an array configuration for the array of pick-up heads 144 that meets the needs or desires for a particular application.

The array of pick-up heads 144 can be configured to have an adjustable pitch that can be reversibly changed between a source-matching pitch and a bonding head-matching pitch. The array of pick-up heads 144 or the pick-up head stage 142 can include motors, electrical components or the like that can be activated to move pick-up heads to achieve a desired pitch. The apparatus 100 can be configured to allow at least one pitch change per transfer cycle. On average, the pitch for array of pick-up heads 144 can change twice during a transfer cycle. As used herein, a pitch is the sum of a width or a length of a feature and the space between the feature and the immediately adjacent feature. The features can be chips at a source substrate, pick-up heads within the array of pick-up heads 144, bonding heads within the array of bonding heads 124, or destination bonding sites of the destination substrate 158. The pitch along the X-direction may be the same or different from the pitch in the Y-direction.

In an embodiment, the array of pick-up heads 144 can be at the source-matching pitch when picking up a set of chips from the source chuck 122 and at the bonding head-matching pitch when transferring the chips to the array of bonding heads 124. After the chips are transferred to the array of bonding heads 124, the pitch for the array of pick-up heads 144 can be changed back to the source-matching pitch before picking up the next set of chips for the next transfer cycle.

The array of bonding heads 124 are coupled to the bridge 120. Each of the bonding heads within the array of bonding heads 124 has a bridge-side major surface and a docking-side major surface opposite the bridge-side major surface. As illustrated in the embodiment of FIG. 1, the bonding heads are coupled to the bridge 120 along the bridge-side major surfaces. The docking-side major surfaces are spaced apart from the docking station 150. During an operation to reconfigure the bonding heads to a different bonding head pitch, the docking-side major surfaces will become coupled to the docking station 150.

Similar to the array of pick-up heads 144, the array of bonding heads 124 can be configured as a vector (a row or a column of bonding heads 124) or as a matrix (at least two rows and at least two columns of bonding heads 124). Regarding the matrix, the number of bonding heads within the array of bonding heads 124 may be different between rows, between columns, or between rows and columns. Some array configurations can be 3×1, 6×1, 2×2, 2×3, 2×4, 4×2, 10×10, or another rectangular shape, where the first number corresponds to the number of bonding heads along a row or column, and the second number corresponds to the number of bonding heads along the other of the row or column. In theory, chips from an entire wafer could be transferred all at once. For such a configuration, the array of bonding heads 124 will have fewer bonding heads along rows closer to the top and bottom of the array as compared to the row or the pair of rows closest to the center of the array, and the array of bonding heads 124 will have fewer bonding heads along columns closer to the left-side and right-side of the array as compared to the column or the pair of columns closest to the center of the array. After reading this specification, skilled artisans will be able to determine an array configuration for the array of bonding heads 124 that meets the needs or desires for a particular application. In an embodiment, the array of bonding heads 124 has the same number of rows and columns as compared to the array of pick-up heads 144.

Each of the bonding heads within the array of bonding heads 124 can include a chip chuck and a body disposed between the chip chuck and the bridge 120. The bonding heads may be configured such that the chip chucks have a limited range of motion relative to their corresponding bodies to provide better positioning when chips are transferred from the array of bonding heads 124 to the destination substrate 158 when coupled to the destination chuck 148.

Better positioning of the chips may be accomplished by measuring an alignment error as a position of each chip on each bonding head relative to an ideal position of the chip on the bonding head. The controller 160 or a local controller can use the alignment error and determine an amount of positioning of the chip so that the chip will be more closely aligned to its corresponding destination bonding site of the destination substrate 158. The chip is held by a chip chuck of the bonding head. The controller 160 or a local controller can transmit a signal, so that the position of each chip is adjusted by moving the chip chuck of the bonding head using the limited range of motion of the chip chuck relative to its corresponding body. Thus, in an embodiment, moving the chip chuck allows the position of the chip to be adjusted relative to the destination substrate 158 that is held by the destination chuck 148. If a chip is within a misalignment tolerance, not all chips may need to be positioned.

The amount that the position of the chip chuck is adjusted is less than an amount that the bonding head is moved using the docking station 150. In an embodiment, the amount that the position is adjusted is at least an order of magnitude less than an amount that the bonding head is moved using the docking station 150. Systems for measuring the alignment error are well known in the art and may include one or more of: cameras, interferometers, reference marks, etc. which are used for measuring alignment errors of the chips on the array of bonding heads 124. Each bonding head may include positioning stages which are well known in the art and can be used for adjusting a position of each chip on each bonding head relative to a destination substrate on a destination chuck based on the measured alignment error.

Figure 2:
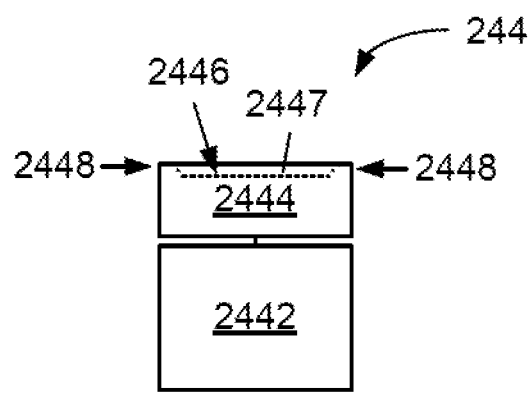
FIG. 2 includes an illustration of a side view of a bonding head in accordance with an embodiment.

FIG. 2 includes a side view of an exemplary bonding head 244 that can be within the plurality of bonding heads 124 in accordance with an embodiment. The bonding head 244 includes a body 2442 and a chip chuck 2444. When the bonding head 244 is coupled to the bridge 120, the body 2442 is disposed between the bridge 120 and the chip chuck 2444. The bonding head 244 has a chip retention region 2446 that faces the base 140 or a component coupled to the base 140 as illustrated in FIG. 1. Thus, the bonding head 244 in FIG. 2 is flipped upside down as compared to the bonding heads illustrated in FIG. 1. A chip will contact the chip chuck 2444 within the chip retention region 2446 that is within a recession 2447. If the chip is too thin and would not otherwise extend outside the recession 2447, a backing plate can be attached to the chip. The backing plate would contact the chip chuck 2444, and a surface of the chip would extend outside the recession 2447. A portion 2448 of the chip chuck 2444 defines the periphery of the chip retention region 2446. The portion 2448 is a coupling zone and allows for physical contact to the docking station 150 or a component (not illustrated), where the component is coupled to the docking station 150. Thus, the bonding head 244 can be moved using the docking station 150 without contacting a surface within the chip retention region 2446.

The bonding head 244 in FIG. 2 is a non-limiting embodiment, and other designs are possible. In another design, the recession 2447 may not be present, and the chip retention region 2446 may be co-planar with the portion 2448 of the chip chuck 2444. The docking station 150 can be designed to contact the chip chuck 2444 outside the chip retention region 2446. In the same or another embodiment, a component may be used between the docking station 150 and the chip chuck 2444. For example, the component can be similar to a gasket or have an elastomeric material (for example, a silicone, a polybutylene material, or a rubber material) with an opening corresponding to the chip retention region 2446. After reading this specification, skilled artisans will be able to determine designs for the bonding heads within the array of bonding heads 124 and the docking station 150 to allow bonding heads to be moved with a reduced risk of contact between a chip retention region 2446 and the docking station 150 or a component coupled to the docking station 150. Sensors can sense when a bonding head is at or close to the docking station 150 and the bridge 120. The sensors may be connected to the docking station 150, the bridge 120, the bonding heads, or a combination thereof.

Referring to FIG. 1, the destination chuck 148 can be coupled to the destination stage 146 that is coupled to the bridge 120. In an embodiment, the destination chuck 148 is attached to the destination stage 146. The destination chuck 148 can hold the destination substrate 158 having destination bonding sites. The destination chuck 148 can be a vacuum chuck, pin-type chuck, a groove-type chuck, an electrostatic chuck, an electromagnetic chuck, or the like. The destination chuck 148 can be heated, cooled, or both heated and cooled. The destination chuck 148 can include a heater. In the same or different embodiment, a fluid (not illustrated) can flow through the destination chuck 148 to increase or decrease the temperature of the destination chuck 148.

The destination substrate 158 is coupled to the destination chuck 148 and has destination bonding sites (not separately illustrated) to which chips from the plurality of chips 132 will be bonded. The destination substrate 158 can be an intermediate substrate or a final product substrate. The destination substrate 158 can include any of the substrates described with respect to the source substrate and can also include a semiconductor wafer, a package substrate, a printed wiring board, a circuit board, an interposer, or the like. Microelectronic devices may be part of the destination substrate 158, such as a semiconductor wafer. The package substrate, the printed wiring board, the circuit board, or the interposer may or may not have chips mounted thereto. Part of all of the side of the destination substrate 158 can be activated for hybrid bonding. Care may be exercised to avoid or at least reduce the likelihood of contacting an activated surface.

The apparatus 100 can be operated using a controller 160 in communication with the bridge 120, any component coupled to the bridge 120, the base 140, any component coupled to the base 140, or any combination thereof. The controller 160 can operate using a computer readable program, optionally stored in memory 162. The controller 160 can include a processor (for example, a central processing unit of a microprocessor or microcontroller), a field-programmable gate array (FPGA), an application specific integrated circuit (ASIC), or the like. The controller 160 can be within the apparatus 100. In another implementation (not illustrated), the controller 160 can be at least part of a computer external to the apparatus 100, where such computer is bidirectionally coupled to the apparatus 100. The memory 162 can include a non-transitory computer readable medium that includes instructions to carry out the actions associated with or between transfer operations. In another embodiment, the bridge 120, a component coupled to the bridge 120, the base 140, or a component coupled to the base 140 can include a local controller that provides some of the functionality that would otherwise be provided by the controller 160.

The docking station 150 can be coupled to and decoupled from bonding heads within the array of bonding heads 124. The docking station 150 is coupled to the destination stage 146 that allows the docking station 150 to be translated in the X-direction, the Y-direction, or both. The apparatus 100 can be configured to allow a head to be moved away from or closer to the bridge before the docking station 150 is translated in the X-direction, the Y-direction, or both. As compared to the array of pick-up heads 144, the docking station 150 and destination stage 146 allow the bonding heads to be more precisely and accurately placed. The time needed to change arrangements of the array of bonding heads 124 takes longer than changing the pitch for the array of pick-up heads 144; however, changing an arrangement of the array of bonding heads 124 can occur less frequently. For example, the arrangement of the array of bonding heads 124 may be changed between transfer operations (for example, between a pair of destination substrates) and not during a transfer operation.

Couplers can be used to couple the array of bonding heads 124 to the bridge 120 and to the docking station 150. A coupler can be vacuum based, electromagnetic, mechanical, or the like. The coupler may be partly or completely within the bridge 120, the docking station 150, a bonding head within the array of bonding heads 124, or a combination thereof. Along the bridge, different locations may use the same coupler or different couplers.

Figure 3:
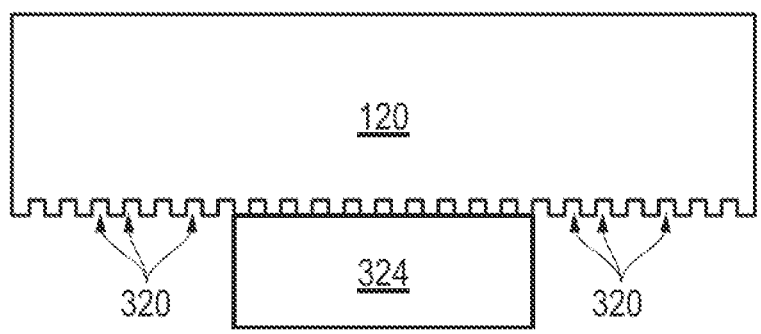
FIG. 3 includes an illustration of a cross-sectional view of portions of the bridge and a bonding head that use a vacuum-based coupler to couple the bridge and the bonding head together.

For an exemplary vacuum-based coupler, referring to FIGS. 1 and 3, the bridge 120 can include vacuum channels 320 that helps to couple the bonding head 324 to the bridge 120. Only a portion of a body of the bonding head 324 is illustrated in FIG. 3. The vacuum channels can be coupled by a vacuum actuator controlled by the controller 160 or local controller within the bridge 120. The vacuum actuator can be a valve, a regulator, or the like. A vacuum source may be within the apparatus 100 or external to the apparatus 100. Suction from the vacuum keeps the bonding head in position. Thus, coupling can occur by activating the vacuum actuator, and decoupling can occur by deactivating the vacuum actuator corresponding to a vacuum zone. A vacuum-based coupler for the docking station 150 can be configured and operate substantially as described with respect to the vacuum-based coupler for the bridge 120. In an alternative embodiment, the bonding head 324 has the vacuum channels, and vacuum is supplied from a vacuum source in the bonding head or a source form one or more of the docking station 150, the base 140, the bridge 120, etc.

Figure 4:
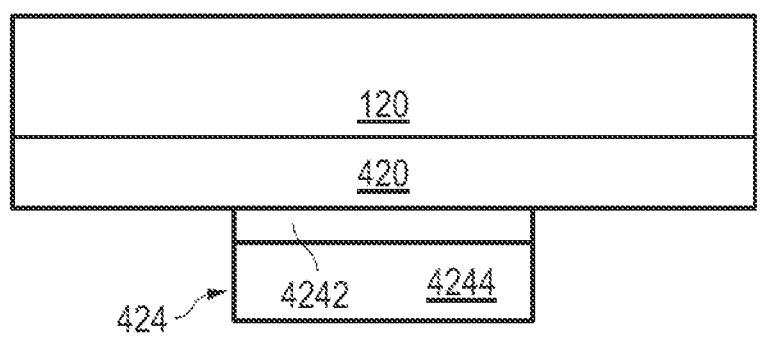
FIG. 4 includes an illustration of a cross-sectional view of portions of the bridge and a bonding head that use an electromagnetic coupler to couple the bridge and the bonding head together.

For an electromechanical coupler, a circuit can be within the bridge 120 or a bonding head, and an electromagnetic material within the bonding head or bridge 120 can be activated when the circuit is turned on and deactivated when the circuit is turned off. In FIG. 4, the bridge 120 can include the circuit 420, and the bonding head 424 can include an electromagnetic material 4242 and a body 4244. Only a portion of the body 4244 is illustrated in FIG. 4. In another embodiment, electromagnetic material 4242 can be in the bridge 120, and the circuit 420 can be in the bonding head 424. The magnetic force from the electromagnetic material 4242 is sufficient to hold the bonding head in position. Thus, coupling can occur by activating the circuit 420, and decoupling can occur by deactivating the circuit that is controlled by the controller 160 or a local controller. An electromagnetic-based coupler for the docking station 150 can be configured and operate substantially as described with respect to the electromagnetic-based coupler for the bridge 120.

Figure 5:
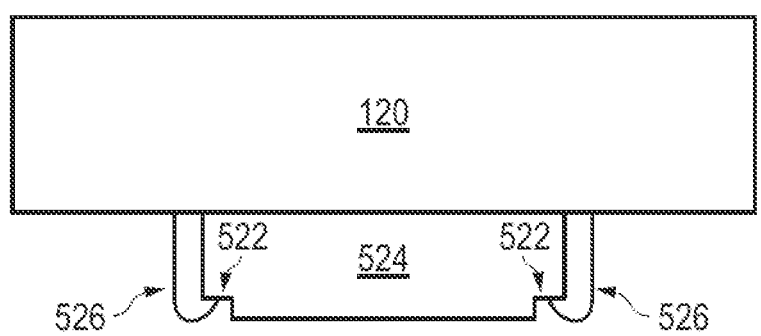
FIG. 5 includes an illustration of a cross-sectional view of portions of the bridge and a bonding head that use a mechanical coupler to couple the bridge and the bonding head together.

For a mechanical coupler, a hook, a clip, a pair of projections or the like can be used to hold a bonding head in position. In FIG. 5, the bonding head 524 had shoulders 522 that can allow clips 526 to hold the bonding head 524 in place relative to the bridge 120. Only a portion of a body of the bonding head 524 is illustrated in FIG. 5. The mechanical coupler can be manually set or activated by an electrical circuit that is within the bridge 120 or the bonding head. For the electrical circuit, coupling can occur by activating the circuit, and decoupling can occur by deactivating the circuit, and such activation/deactivation can be controlled by the controller 160 or a local controller. A mechanical coupler for the docking station 150 can be configured and operate substantially as described with respect to the mechanical coupler for the bridge 120.

Figure 7:
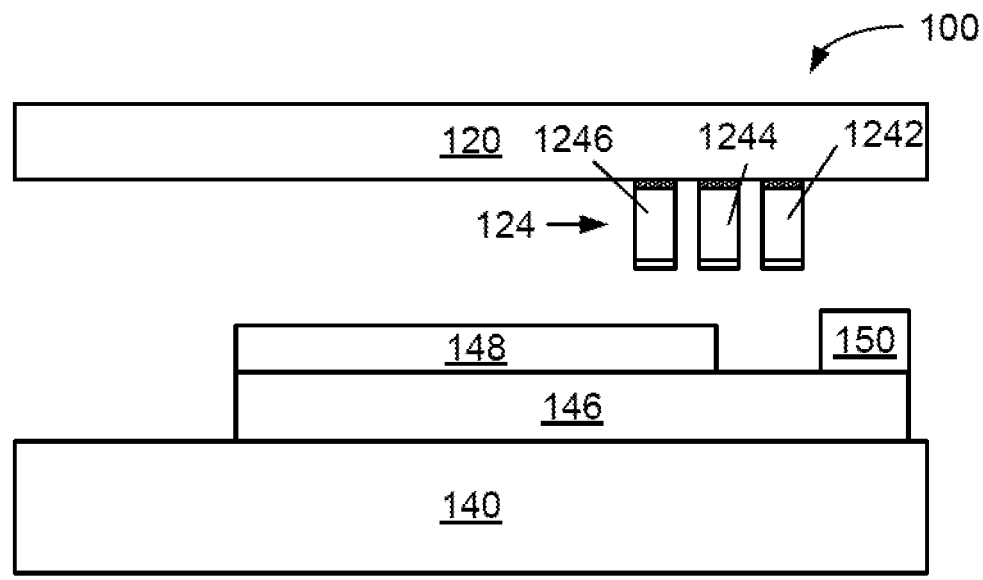
FIG. 7 includes an illustration of a cross-sectional view of a portion of the apparatus of FIG. 1 before moving bonding heads.

Before addressing the method, illustrated coupling conventions with respect to the bonding heads are addressed. FIG. 7 includes an array of bonding heads 124 that have coupling zones on opposite ends of the bonding heads 1242, 1244, and 1246. A shaded coupling zone is used to designate that a coupler is active (coupled), and a clear (unshaded) coupling zone is used to designate that a coupler is deactivated (uncoupled). In FIG. 7, the bridge-side couplers are active, and the docking-side couplers are deactivated. The same conventions are used in the other figures.

Figure 6:
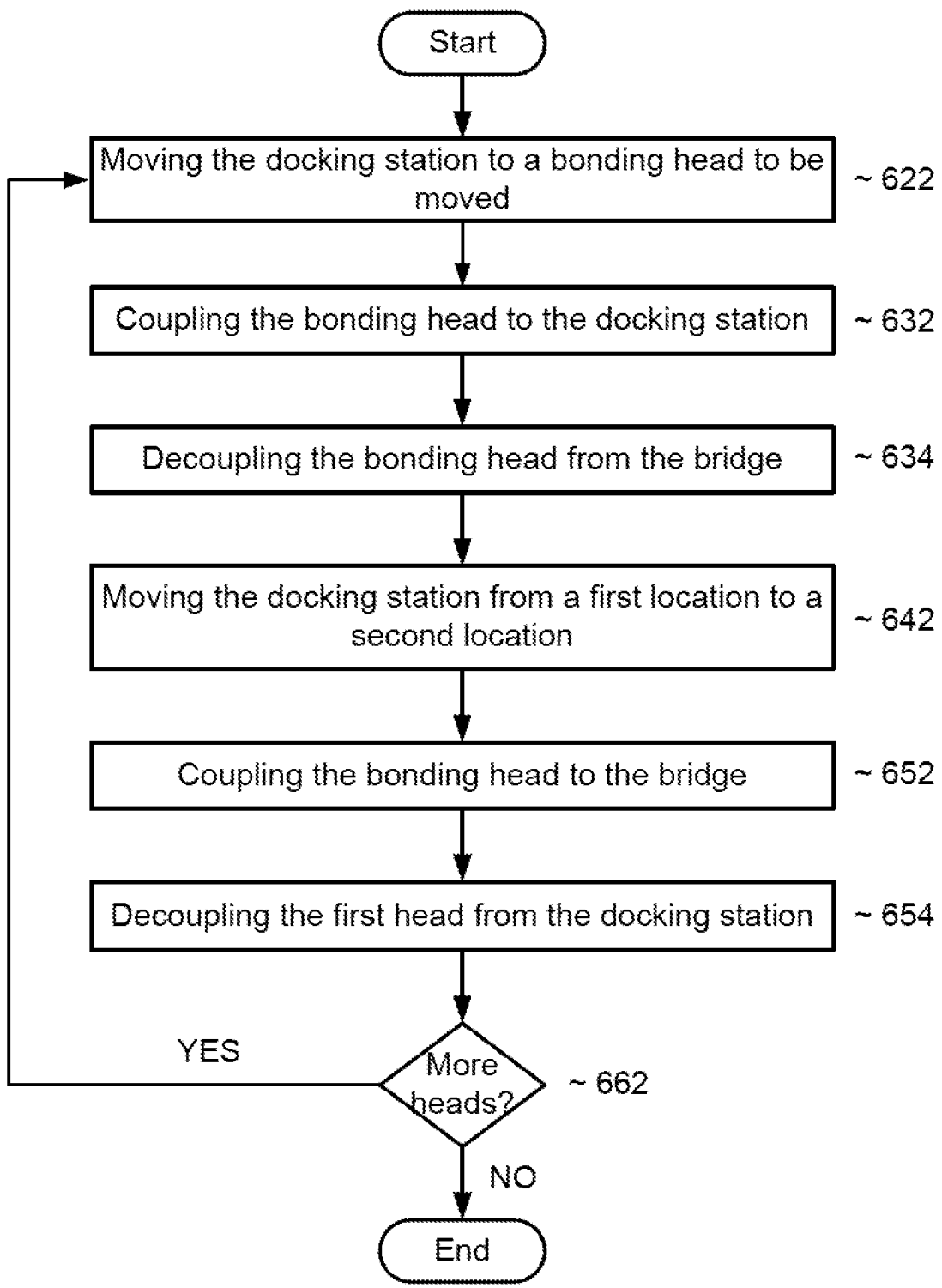
FIG. 6 includes a process flow diagram for a method of positioning a plurality of bonding heads between chip transfer operations.

Attention is directed to methods of using the apparatus 100 when moving bonding heads within the array of bonding heads 124. FIG. 6 includes a process flow diagram of a method that is described with respect to FIGS. 7 to 20. Some portions of the apparatus 100 illustrated in FIG. 1 are not illustrated in FIGS. 7 to 20 to simplify understanding of the method. FIGS. 7 to 20 do not illustrate the destination substrate 158 (in FIG. 1) overlying the destination chuck 148. During the method, the destination chuck 148 can have an exposed upper surface, or the destination substrate 158 or a dummy substrate (for example, a bare silicon wafer, a glass plate, or the like) may overlie the destination chuck 148 to protect the destination chuck 148 during the methods described below.

Before beginning the description of the method corresponding to FIG. 6, some actions have been or may be performed. The arrangement of the array of bonding heads 124 correspond to destination bonding sites for a prior destination substrate where chips have been bonded to the destination bonding sites of the prior destination substrate. Thus, a transfer operation has been completed. Before a next transfer operation starts for a next destination substrate, the array of bonding heads 124 are adjusted for the locations and the destination pitch of destination bonding sites of the next destination substrate. The method corresponding to FIG. 6 is performed between immediately sequential transfer operations.

Figure 8:
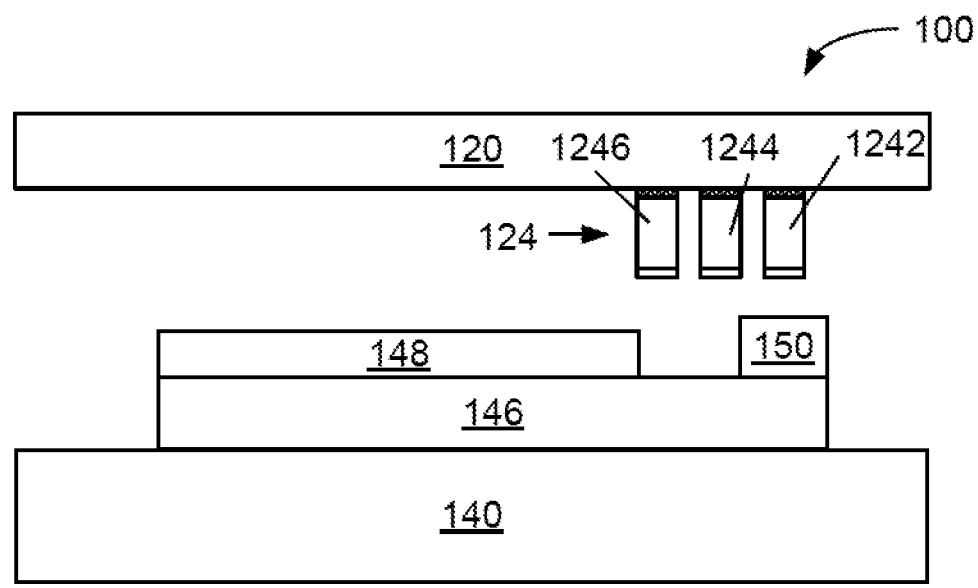
FIG. 8 includes an illustration of a cross-sectional view of the portion of the apparatus of FIG. 7 after moving a docking station into position for a bonding head.

The method can include moving the docking station to a bonding head to be moved at block 622 in FIG. 6. FIG. 7 includes a cross-sectional view of a portion of the apparatus, and portion includes the bridge 120, the array of bonding heads 124 including bonding heads 1242, 1244, and 1246, the base 140, the destination stage 146, the destination chuck 148, and the docking station 150. The array of the bonding heads 124 can include more or fewer bonding heads as compared to the embodiment illustrated in FIG. 1. The bridge-side coupling zones of the bonding heads 1242, 1244, and 1246 are shaded because the bonding heads 1242, 1244, and 1246 are coupled to the bridge 120. Referring to FIGS. 7 and 8, the controller 160 or a local controller can transmit a signal for the destination stage 146 to move so that the docking station 150 is under the bonding head 1242.

Figure 9:
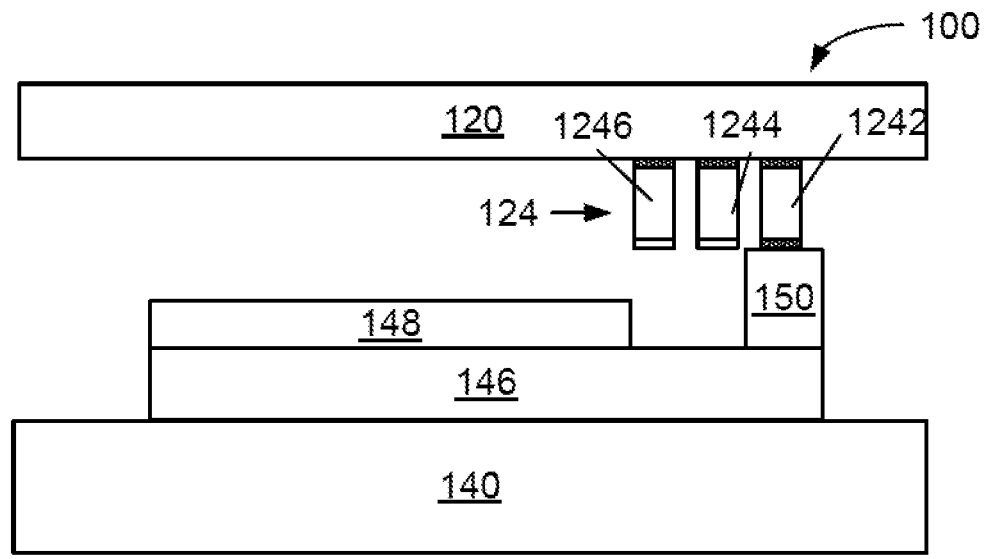
FIG. 9 includes an illustration of a cross-sectional view of the portion of the apparatus of FIG. 8 after activating a docking-side coupler to couple the bonding head and the docking station together.

The method can further include coupling the bonding head to the docking station at block 632 in FIG. 6. Referring to FIG. 9, the docking station 150 is extended to contact the bonding head 1242. Alternatively, the bridge 120, the base 140, or the destination stage 146 can be moved so that the docking station 150 contacts the bonding head 1242. Data from a sensor can provide to the controller 160 or a local controller information that the docking station 150 and the bonding head 1242 are at or close to each other. The controller 160 or the local controller can transmit a signal for the docking-side coupler for the bonding head 1242 to be activated and couple the bonding head 1242 to the docking station 150.

The method can include decoupling the bonding head from the bridge at block 634 in FIG. 6. The controller 160 or a local controller can send a signal for the bridge-side coupler for the bonding head 1242 to deactivate and decouple the bonding head 1242 from the bridge 120 in FIG. 10.

Figure 10:
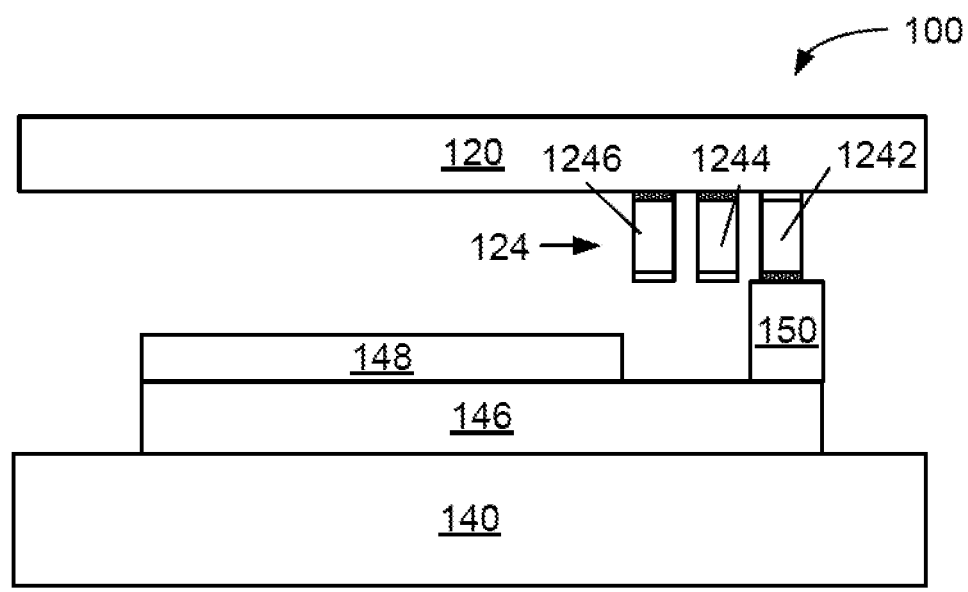
FIG. 10 includes an illustration of a cross-sectional view of the portion of the apparatus of FIG. 9 after deactivating a bridge-side coupler to decouple the bonding head and a bridge from each other.
Figure 11:
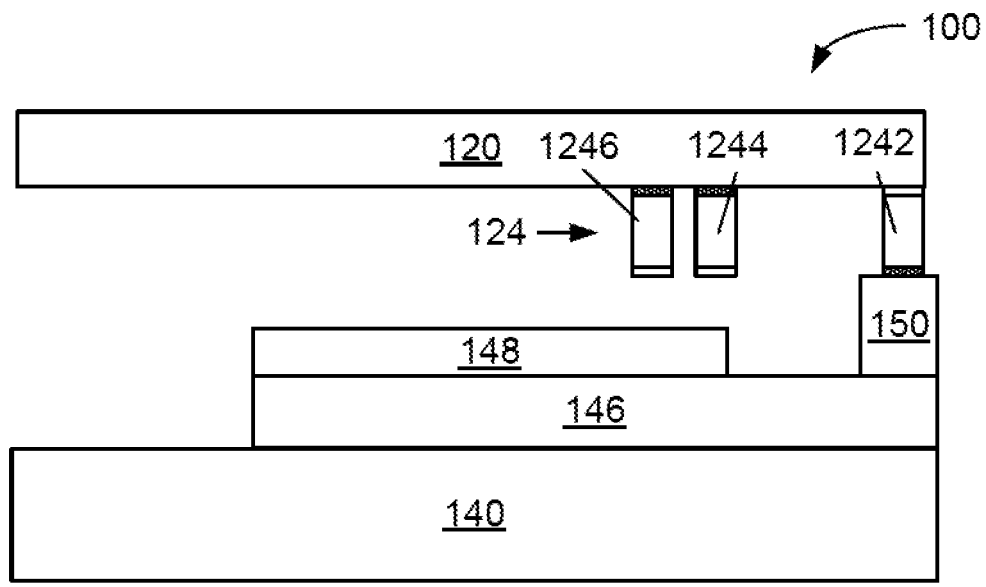
FIG. 11 includes an illustration of a cross-sectional view of the portion of the apparatus of FIG. 10 after moving the bonding head into its desired position.

The method can further include moving the docking station from a first location to a second location at block 642 in FIG. 6. Referring to FIGS. 10 and 11, the controller 160 or a local controller can transmit a signal for the destination stage 146 to move so that the bonding head 1242 is under a desired location along the bridge 120. The bonding head 1242 can be moved away from the bridge 120 before the destination stage 146 moves along the X-Y plane, and the bonding head 1242 can be moved closer to the bridge 120 after the destination stage 146 moves along the X-Y plane. In FIG. 11, the desired location for the bonding head 1242 is close to the right-hand side of the bridge 120.

Figure 12:
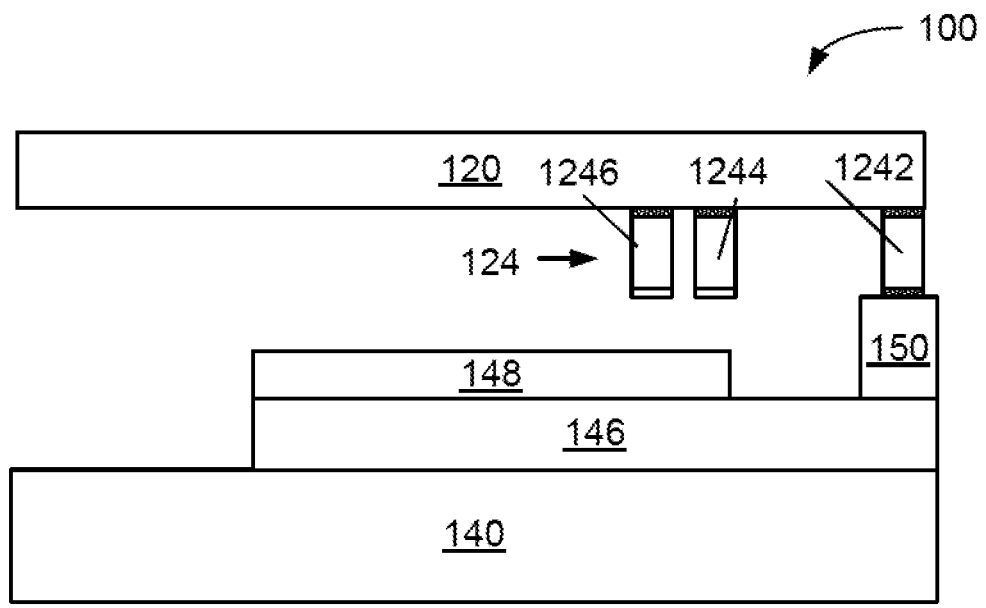
FIG. 12 includes an illustration of a cross-sectional view of the portion of the apparatus of FIG. 11 after activating the bridge-side coupler to couple the bonding head and the bridge together.

The method can further include coupling the bonding head to the bridge at block 652 in FIG. 6. Referring to FIG. 12, data from a sensor can provide to the controller 160 or a local controller information that the docking station 150 and the bonding head 1242 are at or close to each other. The controller 160 or a local controller can transmit a signal for the bridge-side coupler for the bonding head 1242 to be activated and couple the bonding head 1242 to the bridge 120.

The method can include decoupling the bonding head from the docking station at block 654 in FIG. 6. The controller 160 or a local controller can send a signal for the docking-side coupler for the bonding head 1242 to deactivate and decouple the bonding head 1242 from the docking station 150 in FIG. 13. The docking station 150 can be moved away from the bonding head 1242. At this point in the process, the bonding head 1242 is at the desired location corresponding to a destination bonding site for the next destination substrate.

A determination is made whether any more bonding heads need to be moved, at decision diamond 662 in FIG. 6. If no further bonding heads need to be moved ("NO" branch), the method ends. If another bonding head needs to be moved ("YES" branch), actions corresponding to blocks 622, 632, 634, 642, 652, and 654 are repeated for another bonding head. In the embodiment illustrated in FIG. 13, the bonding head 1244 needs to be moved to its desired location corresponding to another destination bonding site for the next destination substrate.

Figure 13:
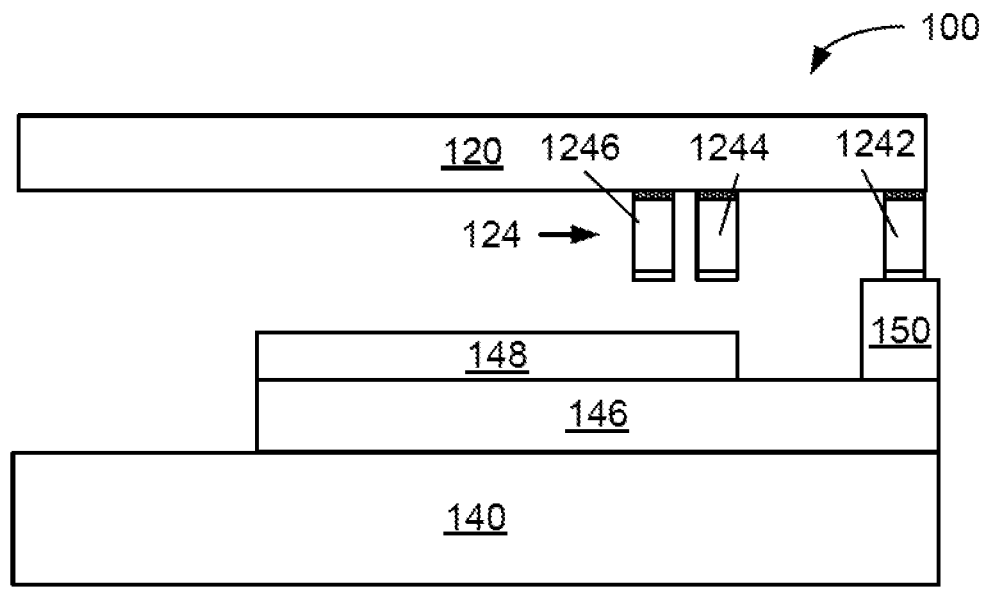
FIG. 13 includes an illustration of a cross-sectional view of the portion of the apparatus of FIG. 12 after deactivating a docking-side coupler to decouple the bonding head and the docking station from each other.
Figure 14:
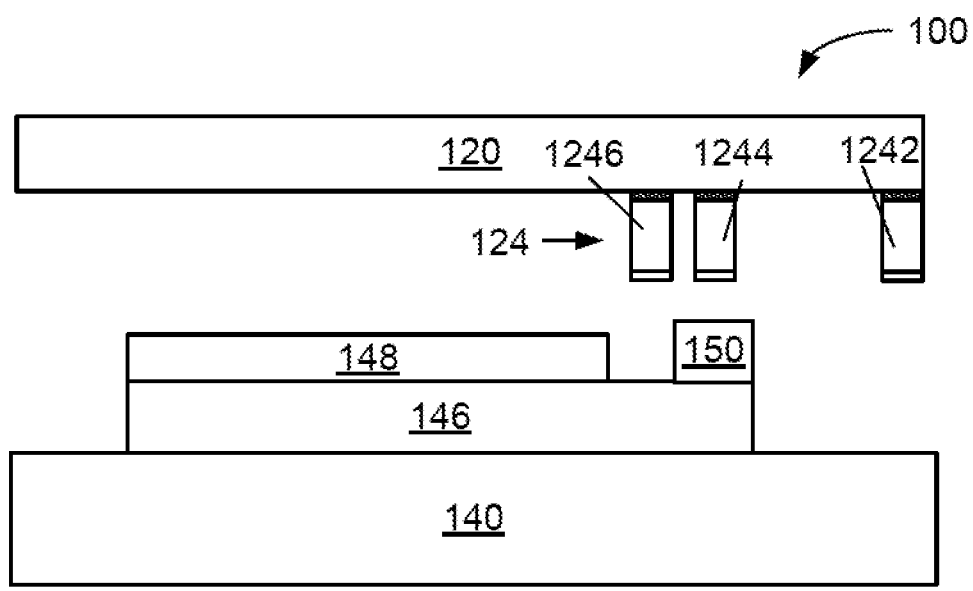
FIG. 14 includes an illustration of a cross-sectional view of the portion of the apparatus of FIG. 13 after moving the docking station into position for another bonding head.

The method can include moving the docking station to a bonding head to be moved at block 622 in FIG. 6. Referring to FIGS. 13 and 14, the controller 160 or a local controller can transmit a signal for the destination stage 146 to move so that the docking station 150 is under the bonding head 1244.

Figure 15:
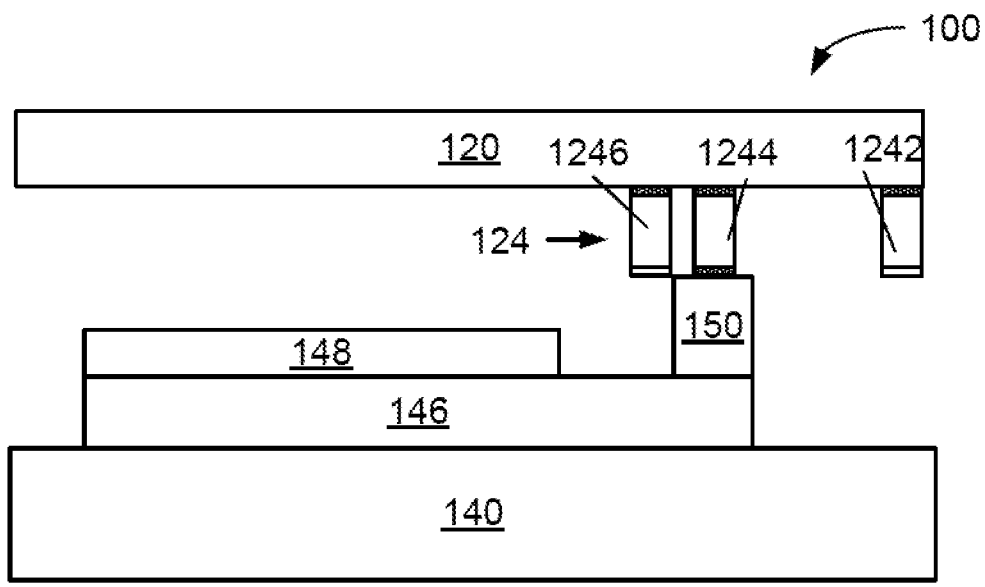
FIG. 15 includes an illustration of a cross-sectional view of the portion of the apparatus of FIG. 14 after activating the docking-side coupler to couple the other bonding head and the docking station together.

The method can further include coupling the bonding head to the docking station at block 632 in FIG. 6. Referring to FIG. 15, the docking station 150 is extended to contact the bonding head 1244. Alternatively, the bridge 120, the base 140, or the destination stage 146 can be moved so that the docking station 150 contacts the bonding head 1242. The controller 160 or a local controller can send a signal for the docking-side coupler for the bonding head 1244 to be activated and couple the bonding head 1244 to the docking station 150.

The method can include decoupling the bonding head from the bridge at block 634 in FIG. 6. The controller 160 or a local controller can send a signal for the bridge-side coupler for the bonding head 1244 to deactivate and decouple the bonding head 1244 from the bridge 120 in FIG. 16.

Figure 16:
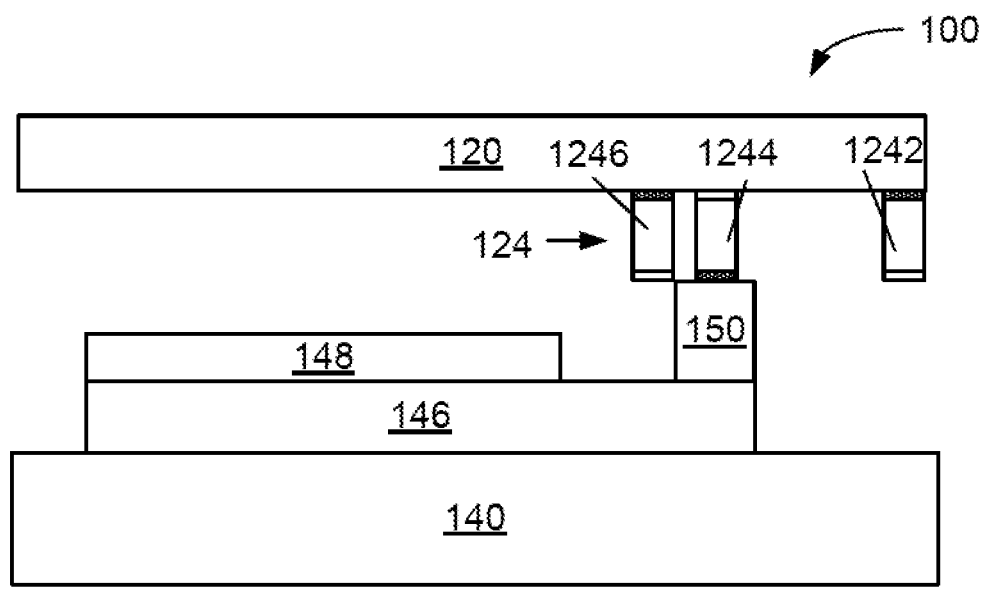
FIG. 16 includes an illustration of a cross-sectional view of the portion of the apparatus of FIG. 15 after deactivating the bridge-side coupler to decouple the other bonding head and the bridge from each other.
Figure 17:
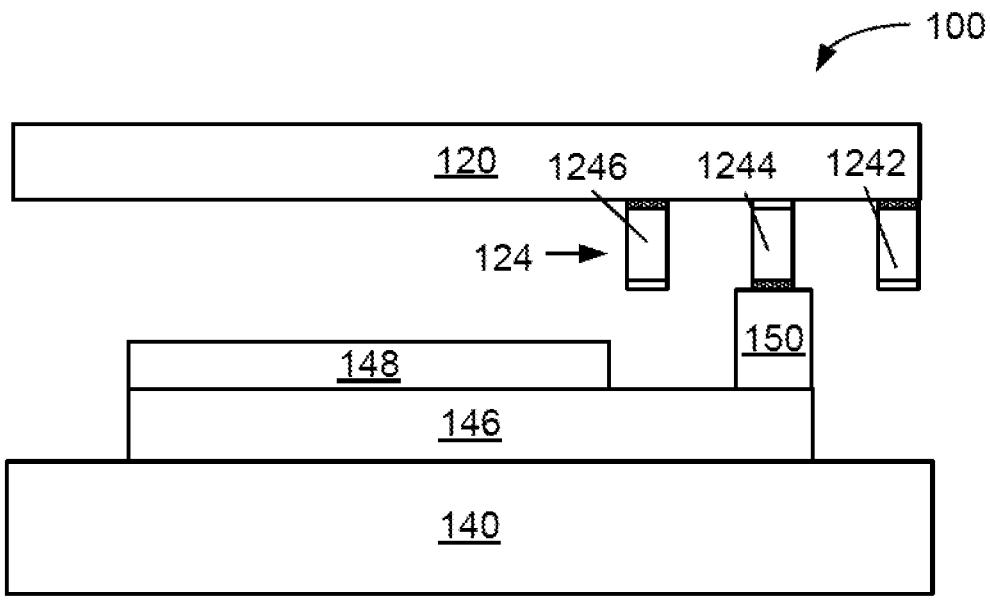
FIG. 17 includes an illustration of a cross-sectional view of the portion of the apparatus of FIG. 16 after moving the other bonding head into its desired position.

The method can further include moving the docking station from a first location to a second location at block 642 in FIG. 6. Referring to FIGS. 16 and 17, the controller 160 or a local controller can transmit a signal for the destination stage 146 to move so that the bonding head 1244 is under a desired location along the bridge 120. The bonding head 1244 can be moved away from the bridge 120 before the destination stage 146 moves along the X-Y plane, and the bonding head 1244 can be moved closer to the bridge 120 after the destination stage 146 moves along the X-Y plane. In FIG. 17, the desired location for the bonding head 1244 is midway between the bonding heads 1242 and 1246.

Figure 18:
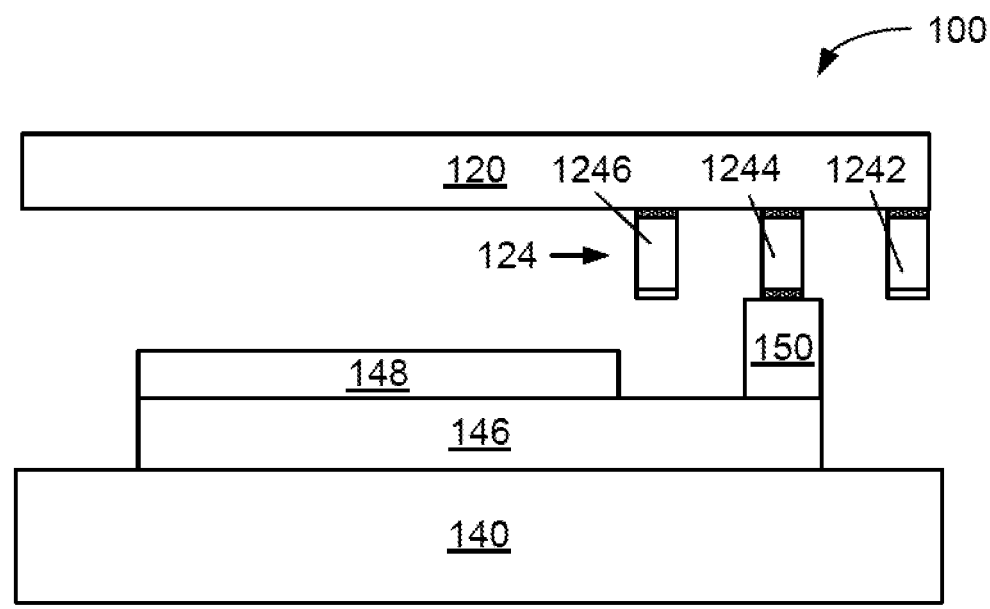
FIG. 18 includes an illustration of a cross-sectional view of the portion of the apparatus of FIG. 17 after activating the bridge-side coupler to couple the other bonding head and the bridge together.
Figure 19:
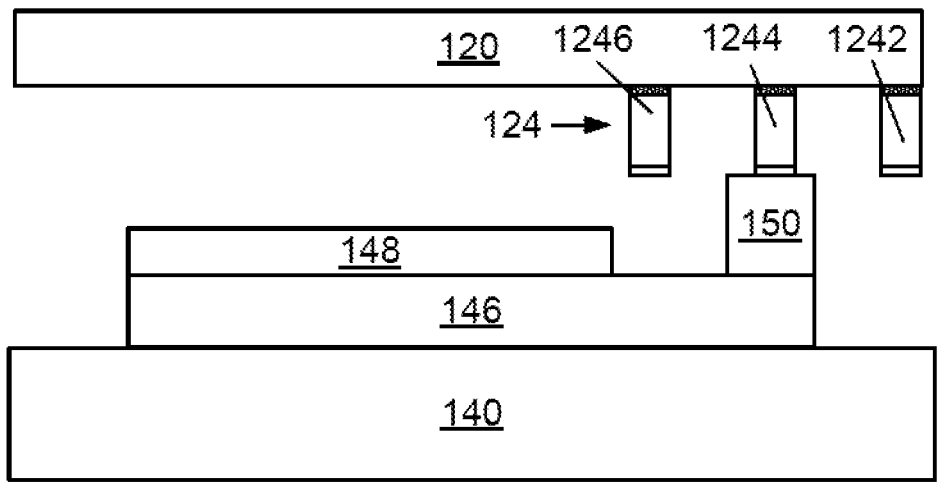
FIG. 19 includes an illustration of a cross-sectional view of the portion of the apparatus of FIG. 18 after deactivating a docking-side coupler to decouple the other bonding head and the docking station from each other.

The method can further include coupling the bonding head to the bridge at block 652 in FIG. 6. Referring to FIG. 18, data from a sensor can provide to the controller 160 or a local controller information that the docking station 150 and the bonding head 1242 are at or close to each other. The controller 160 or a local controller can transmit a signal for the bridge-side coupler for the bonding head 1244 to be activated and couple the bonding head 1244 to the bridge 120.

The method can include decoupling the bonding head from the docking station at block 654 in FIG. 6. The controller 160 or a local controller can send a signal for the docking-side coupler for the bonding head 1244 to deactivate and decouple the bonding head 1244 from the docking station 150 in FIG. 19. The docking station 150 can be moved away from the bonding head 1244 in FIG. 20. At this point in the process, the bonding head 1244 is at the desired location corresponding to a destination bonding site for the next destination substrate.

A determination is made whether any more bonding heads need to be moved, at decision diamond 662 in FIG. 6. If no further bonding heads need to be moved ("NO" branch), the method ends. If another bonding head needs to be moved ("YES" branch), actions corresponding to blocks 622, 632, 634, 642, 652, and 654 are repeated for another bonding head. No further bonding head needs to be moved, so the method can end. In the embodiment illustrated in FIG. 20, the bonding head 1246 was not moved during the method corresponding to FIG. 6. Thus, not all bonding heads need to be moved between a pair of immediately sequential transfers operations.

The method described above can be used to move one head at a time. In another embodiment, a set of heads can be moved at the same time. For example, the bonding head 1242 or 1244 may be a bonding head along a column in the Y-direction, and all bonding heads along that same column may be moved at the same time. In another example, a set of heads may be along different rows or columns. After reading this specification, skilled artisans will be able to determine how many and which bonding heads to move at the same time.

After the method corresponding to FIG. 6 is completed, the next destination substrate can be coupled to the destination chuck 148 if this has not already occurred. If a dummy substrate was placed on the destination chuck 148, the dummy substrate can be removed after the method is completed and before the next destination substrate is coupled to the destination chuck 148. If the prior destination substrate and the next destination substrate have the same design (for example, the same part number), the array of bonding heads 124 may not need to be repositioned between transfer operations for the prior destination substrate and the next transfer operation for the next destination substrate. A minor re-alignment of the next destination substrate 158 to the bonding heads may be performed, as the prior and next substrates may not have been placed on the same exact location over the destination chuck 148.

Figure 20:
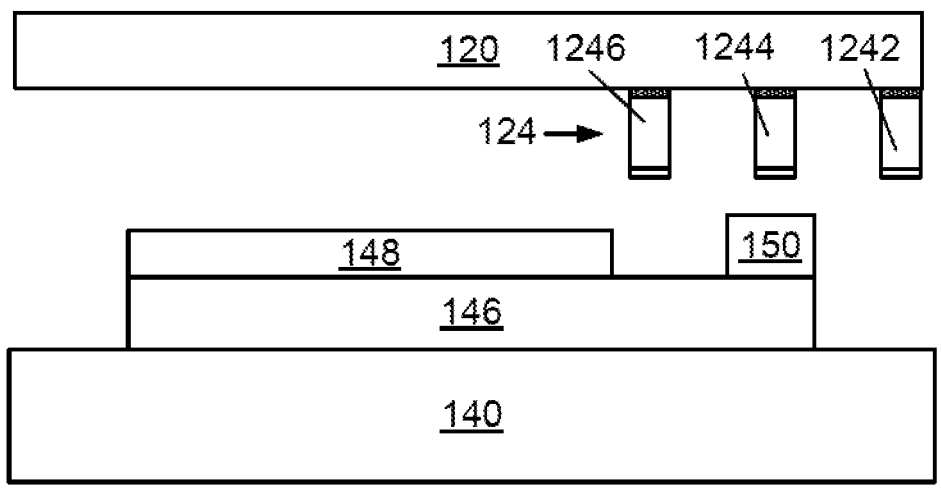
FIG. 20 includes an illustration of a cross-sectional view of the portion of the apparatus of FIG. 19 after moving the docking station away from the other bonding head.

When comparing FIGS. 7 and 20, the bonding head pitches for the array of bonding heads 124 is different. The bonding head pitch for the array of bonding heads 124 in FIG. 7 is smaller than the bonding head pitch for the array of bonding heads 124 in FIG. 20. In the same or different embodiment, the X-direction bonding head pitch may be changed, and the Y-direction bonding head pitch may remain the same, or vice verse. In a further embodiment, the bonding head pitch may be reduced rather than increased as illustrated in FIGS. 7 and 20.

Embodiments as described herein allow for precise and accurate placement of bonding heads. A docking station can be used during the moving and placement of bonding heads. The docking station can be coupled to a destination stage that allows for precise and accurate positioning of the docking station with respect to corresponding locations along a bridge. Hence, existing equipment can be modified for the docking station allow bonding heads to be changed for different destination substrate designs.

Changing the bonding head pitch for the array of bonding heads is performed less frequently as compared to changing the pick-up head pitch for the array of pick-up heads. Fewer pitch changes for the array of bonding heads allows more focus on stability rather than dynamic/fast performance that is more of a focus when changing the pick-up head pitch for the array of pick-up heads.

Note that not all of the activities described above in the general description or the examples are required, that a portion of a specific activity may not be required, and that one or more further activities can be performed in addition to those described. Still further, the order in which activities are listed is not necessarily the order in which they are performed.

Benefits, other advantages, and solutions to problems have been described above with regard to specific implementations. However, the benefits, advantages, solutions to problems, and any feature(s) that can cause any benefit, advantage, or solution to occur or become more pronounced are not to be construed as a critical, required, or essential feature of any or all the claims.

The specification and illustrations of the implementations described herein are intended to provide a general understanding of the structure of the various implementations. The specification and illustrations are not intended to serve as an exhaustive and comprehensive description of all of the elements and features of apparatus and systems that use the structures or methods described herein. Separate implementations can also be provided in combination in a single implementation, and conversely, various features that are, for brevity, described in the context of a single implementation, can also be provided separately or in any subcombination. Further, reference to values stated in ranges includes each and every value within that range. Many other implementations can be apparent to skilled artisans only after reading this specification. Other implementations can be used and derived from the disclosure, such that a structural substitution, logical substitution, or another change can be made without departing from the scope of the disclosure. Accordingly, the disclosure is to be regarded as illustrative rather than restrictive.

What is claimed is:

1. An apparatus, comprising:
a support structure;
a docking station;
a positioning stage configured to move the docking station relative to the support structure;
a destination chuck coupled to the positioning stage;
a head among a plurality of heads, wherein the head has a chip retention region;
a first coupler configured to couple the head to the support structure and to decouple the head from the support structure; and
a second coupler configured to couple the head to the docking station and to decouple the head from the docking station.

2. The apparatus of claim 1, wherein the head further comprises a body and a chip chuck, wherein the head is configured to allow motion of the chip chuck relative to the support structure.

3. The apparatus of claim 1, further comprising a controller configured to transmit a signal to move a body of the head from a first position on the support structure to a second position on the support structure.

4. The apparatus of claim 1, wherein the second coupler is configured such that the docking station does not contact the chip retention region.

5. The apparatus of claim 1, wherein:
the chip retention region occupies a center portion of a surface facing away from the support structure, and
the head has a first coupling zone that is disposed between a first peripheral side of the head and the chip retention region.

6. The apparatus of claim 5, wherein the first coupling zone is along a first major side of the head, and the head has a second coupling zone along a second major side of the head, wherein the second major side is opposite the first major side.

7. The apparatus of claim 5, wherein the chip retention region is recessed into the head.

8. The apparatus of claim 1, wherein the first coupler, the second coupler, or each of the first coupler and the second coupler includes a zone-based vacuum chuck that is part of or coupled to the support structure.

9. The apparatus of claim 1, wherein the apparatus is configured to allow the head to be moved closer to and away from the support structure.

10. The apparatus of claim 1, further comprising:
a base spaced apart from the support structure, wherein the positioning stage is coupled to the base; and
a source substrate coupled to the support structure, wherein the support structure includes a bridge.

11. The apparatus of claim 10, wherein the plurality of heads is a plurality of bonding heads, and the apparatus further comprises:
a pick-up head stage coupled to the base; and
a plurality of pick-up heads coupled to the pick-up head stage.

12. A method, comprising:
coupling a first head to a docking station by activating a first coupler associated with the docking station, wherein:
an apparatus includes:
a support structure;
the docking station;
a positioning stage configured to move the docking station relative to the support structure;
a destination chuck coupled to the positioning stage;
a plurality of heads including a first head, and the first head has a chip retention region;
the first coupler configured to couple the first head to the support structure and to decouple the first head from the support structure; and
a second coupler configured to couple the first head to the docking station and to decouple the first head from the docking station;
decoupling the first head from the support structure by deactivating the second coupler associated with the support structure;
moving the docking station from a first location along the support structure to a second location along the support structure;
coupling the first head to the support structure by activating a third coupler; and
decoupling the first head from the docking station by deactivating the first coupler.

13. The method of claim 12, further comprising:
coupling a second head to the docking station by activating a fourth coupler associated with the docking station, wherein the plurality of heads includes the second head, and the second head has a chip retention region;
decoupling the second head from the support structure by deactivating a fifth coupler associated with the support structure;
moving the docking station from a third location along the support structure to a fourth location along the support structure;
coupling the second head to the support structure by activating a sixth coupler; and
decoupling the second head from the docking station by deactivating the fourth coupler.

14. The method of claim 13, wherein:
the plurality of heads has a first pitch before moving the docking station from the first location to the second location and before moving the docking station from the third location to the fourth location, and
the plurality of heads has a second pitch after moving the docking station from the first location to the second location and after moving the docking station from the third location to the fourth location, wherein the second pitch is different from the first pitch.

15. The method of claim 14, further comprising:
mounting a destination substrate onto a destination chuck coupled to the positioning stage, wherein the destination substrate has a plurality of destination bonding sites at a destination pitch, wherein the destination pitch is closer to the second pitch than to the first pitch.

16. The method of claim 12, wherein:
moving the docking station is performed between a pair of transfer operations,
the plurality of heads includes a second head, and the second head has a chip retention region, and
the second head is coupled to the support structure and is not moved between the pair of transfer operations.

17. The method of claim 12, wherein:
the first head has a first side adjacent to the support structure and a second side adjacent to the docking station,
the chip retention region is along the second side, and
coupling the first head to the docking station is performed such that a portion of the first head along the second side contacts:
(1) the docking station, and the chip retention region does not contact the docking station, or
(2) a component coupled to the docking station, and the chip retention region does not contact the component coupled to the docking station.

18. The method of claim 12, wherein the plurality of heads is a plurality of bonding heads.

19. The method of claim 18, further comprising:
picking up a set of chips from a source substrate with a plurality of pick-up heads, wherein the plurality of pick-up heads is at a source-matching pitch when picking up the set of chips;
adjusting the plurality of pick-up heads holding the set of chips to a bonding head-matching pitch;
transferring the set of chips from the plurality of pick-up heads to the plurality of bonding heads, wherein the plurality of bonding heads includes the first head, wherein transferring is performed after the first head is moved using the docking station;
measuring alignment errors of the chips held by the plurality of bonding heads;
adjusting positions of at least one of the chips held by a bonding head of the plurality of bonding heads relative to a destination substrate on a destination chuck based on the alignment errors; and
bonding the set of chips to the destination substrate with the plurality of bonding heads.

* * * * *